(12) United States Patent
Hamamoto

(10) Patent No.: US 7,895,505 B2
(45) Date of Patent: Feb. 22, 2011

(54) METHOD FOR DECODING CONVOLUTIONALLY CODED SIGNALS AND DECODING APPARATUS AND RECEIVING APPARATUS USING THE SAME

(75) Inventor: Katsuaki Hamamoto, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 1005 days.

(21) Appl. No.: 11/727,024

(22) Filed: Mar. 23, 2007

(65) Prior Publication Data

US 2007/0222647 A1 Sep. 27, 2007

(30) Foreign Application Priority Data

Mar. 24, 2006 (JP) .............................. 2006-084231
Jan. 30, 2007 (JP) .............................. 2007-018822

(51) Int. Cl.
*H03M 13/03* (2006.01)
(52) U.S. Cl. ..................... 714/786; 714/791; 714/795
(58) Field of Classification Search ................ 714/791, 714/793, 788, 786, 795
See application file for complete search history.

(56) References Cited

U.S. PATENT DOCUMENTS 4,998,253 A * 3/1991 Ohashi et al. ............... 714/791
5,077,743 A * 12/1991 Bitzer et al. ................ 714/795
5,327,441 A * 7/1994 Kawazoe et al. ............ 714/795

FOREIGN PATENT DOCUMENTS

JP 5-244019 9/1993

* cited by examiner

*Primary Examiner*—Sam Rizk
(74) *Attorney, Agent, or Firm*—McDermott Will & Emery LLP

(57) ABSTRACT

An input unit inputs sequentially bit data, where the bit data is convolutionally coded by a generator matrix defined according to a constraint length and a coding rate and has the number of streams defined by the coding rate. A temporary decoded data shift register unit delays temporary decoded data over at least a period of time corresponding to the constraint length. A generation unit generates, per stream, bit data serving as candidates for a decoding, by performing exclusive OR based on the generator matrix on the delayed temporary decoded data and the inputted bit data. A comparator and a selector select any of the bit data per stream generated by the generation unit, as a decoding result, and outputs the selected decoding result.

14 Claims, 11 Drawing Sheets

FIG.2

| CODING RATE | PROCESSING STEP | 1 | 2 | 3 | 4 | 5 | SUPPLEMENT |
|---|---|---|---|---|---|---|---|
| 1/3 | TX_A | TRANSMIT | | | | | |
| | TX_B | TRANSMIT | | | | | TRANSMIT DATA NOT DELETED |
| | TX_C | TRANSMIT | | | | | |
| 1/2 | TX_A | TRANSMIT | | | | | |
| | TX_B | DELETE | | | | | ALWAYS DELETE TX_B |
| | TX_C | TRANSMIT | | | | | |
| 5/8 | TX_A | TRANSMIT | DELETE | TRANSMIT | DELETE | TRANSMIT | |
| | TX_B | TRANSMIT | DELETE | TRANSMIT | DELETE | TRANSMIT | REPEAT OF PROCESSING STEPS 1 TO 5 |
| | TX_C | DELETE | TRANSMIT | DELETE | TRANSMIT | DELETE | |
| 3/4 | TX_A | TRANSMIT | DELETE | DELETE | | | |
| | TX_B | TRANSMIT | DELETE | DELETE | | | REPEAT OF PROCESSING STEPS 1 TO 3 |
| | TX_C | DELETE | TRANSMIT | TRANSMIT | | | |

| ERROR PATTERNS / PROCESSING STEPS | 1 | | | 2 | | | 3 | | | 4 | | | 5 | | | 6 | | | 7 | | | 8 | | |
|---|---|---|---|---|---|---|---|---|---|---|---|---|---|---|---|---|---|---|---|---|---|---|---|---|
| | RX-A | RX-B | RX-C | RX-A | RX-B | RX-C | RX-A | RX-B | RX-C | RX-A | RX-B | RX-C | RX-A | RX-B | RX-C | RX-A | RX-B | RX-C | RX-A | RX-B | RX-C | RX-A | RX-B | RX-C |
| 1 | x | O | — | O | x | — | O | O | — | O | O | — | O | O | — | O | O | — | O | O | — | O | O | — |
| 2 | — | — | O | — | — | O | — | — | x | — | — | O | — | — | O | — | — | O | — | — | O | — | — | O |
| 3 | O | — | — | O | O | — | O | O | — | x | O | — | O | x | — | O | O | — | O | O | — | O | O | — |
| 4 | — | — | O | — | — | O | — | — | O | — | — | O | — | — | O | — | — | x | — | — | O | — | — | O |
| 5 | O | O | — | O | O | — | O | O | — | O | O | — | O | O | — | O | O | — | x | O | — | O | x | — |

| | 510 | 512 | 514 | 516 | 518 | 520 | 522 | 524 |

FIG.6

| ERROR PATTERNS | | 1 | 2 | 3 | 4 | 5 | 6 | 7 | 8 |
|---|---|---|---|---|---|---|---|---|---|
| RELIABILITY INFORMATION SHIFT REGISTER | [0]INPUT VALUES | 1 | 0 | 1 | 1 | 0 | 1 | 1 | 0 |
| | [0]   (0) | 2 | 2 | 2 | 2 | 2 | 2 | 1 | 2 |
| | [1]   (2) | 1 | 1 | 0 | 1 | 0 | 0 | 2 | 0 |
| | [2]   (0) | 0 | 0 | 0 | 2 | 0 | 1 | 0 | 1 |
| | [3]   (2) | 2 | 2 | 2 | 0 | 2 | 2 | 2 | 2 |
| | [4]   (0) | 0 | 0 | 1 | 0 | 1 | 0 | 0 | 0 |
| POSITION OF ERROR IN TEMPORARY DECODED DATA SHIFT REGISTER | TEMPORARY DECODED DATA VALUE SELECTED (WITH UPDATED VALUE OF SR0) | × | | × | × | | × | | |
| | SR0 | × | | × | × | | | × | |
| | SR1 | × | | × | × | | × | | |
| | SR2 | | | | × | | | | |
| | SR3 | | | | × | | × | | |
| | SR4 | | | | | | | | |
| | SR5 | | | | × | | | | |

FIG.7A

| t | RECEIVED DATA 530 | | | DECODING RESULT 532 | | | COMPARISON RESULT OF DEC_A AND DEC_B 534 | TEMPORARY DECODED DATA [0] INPUT 536 | TEMPORARY DECODED DATA SHIFT REGISTER 538 | | | | | | | | | |
|---|---|---|---|---|---|---|---|---|---|---|---|---|---|---|---|---|---|---|
| | RX_A | RX_B | RX_C | DEC_A | DEC_B | DEC_C | | | [0] | [1] | [2] | [3] | [4] | [5] | [6] | [7] | [8] | [9] |
| 1 | 0 | 0 | — | 0 | 0 | — | A=B | 0 | 0 | 0 | 0 | 0 | 0 | 0 | | | |
| 2 | — | — | 1 | — | — | 1 | — | 1 | 0 | 0 | 0 | 0 | 0 | 0 | 0 | | |
| 3 | 0 | 0 | — | 0 | 1 | — | A≠B | 1 | 0 | 0 | 0 | 0 | 0 | 0 | 0 | 0 | |
| 4 | — | — | 0 | — | — | 1 | — | 1 | 0 | 1 | 0 | 0 | 0 | 0 | 0 | 0 | 0 |
| 5 | 0 | 0 | — | 1 | 1 | — | A=B | 1 | 1 | 0 | 1 | 0 | 0 | 0 | 0 | 0 | 0 |
| 6 | 0 | 0 | — | 1 | 1 | — | A=B | 1 | 1 | 1 | 0 | 1 | 0 | 0 | 0 | 0 | 0 |
| 7 | — | — | 0 | — | — | 1 | — | 1 | 1 | 1 | 1 | 0 | 1 | 0 | 0 | 0 | 0 |
| 8 | 0 | 0 | — | 1 | 0 | — | A≠B | 1 | 1 | 1 | 1 | 1 | 0 | 1 | 0 | 0 | 0 |
| 9 | — | — | 0 | — | — | 1 | — | 1 | 1 | 1 | 1 | 1 | 1 | 0 | 1 | 0 | 0 |
| 10 | 0 | 0 | — | 0 | 0 | — | A=B | 0 | 1 | 1 | 1 | 1 | 1 | 1 | 0 | 1 | 0 |
| 11 | 0 | 0 | — | 0 | 1 | — | A≠B | 0 | 0 | 1 | 1 | 1 | 1 | 1 | 1 | 0 | 1 | 0 |

FIG.7B

| t | RECEIVED DATA 530 | | | DECODING RESULT 532 | | | COMPARISON RESULT OF DEC_A AND DEC_B 534 | TEMPORARY DECODED DATA [0] INPUT 536 | TEMPORARY DECODED DATA SHIFT REGISTER 538 | | | | | | | | | |
|---|---|---|---|---|---|---|---|---|---|---|---|---|---|---|---|---|---|---|
| | RX_A | RX_B | RX_C | DEC_A | DEC_B | DEC_C | | | [0] | [1] | [2] | [3] | [4] | [5] | [6] | [7] | [8] | [9] |
| 1 | 0 | 0 | — | 0 | 0 | — | A=B | 0 | 0 | 0 | 0 | 0 | 0 | 0 | | | |
| 2 | — | — | 0 | — | — | 0 | — | 0 | 0 | 0 | 0 | 0 | 0 | 0 | 0 | | |
| 3 | 1 | 0 | — | 1 | 0 | — | A≠B | 1 | 0 | 0 | 0 | 0 | 0 | 0 | 0 | 0 | |
| 4 | — | — | 0 | — | — | 1 | — | 1 | 1 | 0 | 0 | 0 | 0 | 0 | 0 | 0 | 0 |
| 5 | 0 | 0 | — | 1 | 1 | — | A≠B | 1 | 1 | 1 | 0 | 0 | 0 | 0 | 0 | 0 | 0 |
| 6 | 0 | 0 | — | 0 | 0 | — | A=B | 0 | 1 | 1 | 1 | 0 | 0 | 0 | 0 | 0 | 0 |
| 7 | — | — | 0 | — | — | 0 | — | 0 | 0 | 1 | 1 | 1 | 0 | 0 | 0 | 0 | 0 |
| 8 | 0 | 0 | — | 0 | 1 | — | A≠B | 0 | 0 | 0 | 1 | 1 | 1 | 0 | 0 | 0 | 0 |
| 9 | — | — | 0 | — | — | 1 | — | 1 | 0 | 0 | 0 | 1 | 1 | 1 | 0 | 0 | 0 |
| 10 | 0 | 0 | — | 0 | 0 | — | A=B | 0 | 1 | 0 | 0 | 0 | 1 | 1 | 1 | 0 | 0 |
| 11 | 0 | 0 | — | 0 | 0 | — | A=B | 0 | 0 | 1 | 0 | 0 | 0 | 1 | 1 | 1 | 0 |

FIG.7C

| t | RECEIVED DATA 530 | | | DECODING RESULT 532 | | | COMPARISON RESULT OF DEC_A AND DEC_B 534 | TEMPORARY DECODED DATA [0] INPUT 536 | TEMPORARY DECODED DATA SHIFT REGISTER 538 | | | | | | | | | |
|---|---|---|---|---|---|---|---|---|---|---|---|---|---|---|---|---|---|---|
| | RX_A | RX_B | RX_C | DEC_A | DEC_B | DEC_C | | | [0] | [1] | [2] | [3] | [4] | [5] | [6] | [7] | [8] | [9] |
| 1 | 0 | 0 | — | 0 | 0 | — | A=B | 0 | 0 | 0 | 0 | 0 | 0 | 0 | | | |
| 2 | — | — | 0 | — | — | 0 | — | 0 | 0 | 0 | 0 | 0 | 0 | 0 | 0 | | |
| 3 | 0 | 1 | — | 0 | 1 | — | A≠B | 0 | 0 | 0 | 0 | 0 | 0 | 0 | 0 | 0 | |
| 4 | — | — | 0 | — | — | 0 | — | 0 | 0 | 0 | 0 | 0 | 0 | 0 | 0 | 0 | 0 |
| 5 | 0 | 0 | — | 0 | 0 | — | A=B | 0 | 0 | 0 | 0 | 0 | 0 | 0 | 0 | 0 | 0 |
| 6 | 0 | 0 | — | 0 | 0 | — | A=B | 0 | 0 | 0 | 0 | 0 | 0 | 0 | 0 | 0 | 0 |
| 7 | — | — | 0 | — | — | 0 | — | 0 | 0 | 0 | 0 | 0 | 0 | 0 | 0 | 0 | 0 |
| 8 | 0 | 0 | — | 0 | 0 | — | A=B | 0 | 0 | 0 | 0 | 0 | 0 | 0 | 0 | 0 | 0 |
| 9 | — | — | 0 | — | — | 0 | — | 0 | 0 | 0 | 0 | 0 | 0 | 0 | 0 | 0 | 0 |
| 10 | 0 | 0 | — | 0 | 0 | — | A=B | 0 | 0 | 0 | 0 | 0 | 0 | 0 | 0 | 0 | 0 |
| 11 | 0 | 0 | — | 0 | 0 | — | A=B | 0 | 0 | 0 | 0 | 0 | 0 | 0 | 0 | 0 | 0 |

FIG.8

| ERROR PATTERNS / PROCESSING STEPS | 1 (510) | | | 2 (512) | | | 3 (514) | | | 4 (516) | | | 5 (518) | | | 6 (520) | | |
|---|---|---|---|---|---|---|---|---|---|---|---|---|---|---|---|---|---|---|
| | RX-A | RX-B | RX-C | RX-A | RX-B | RX-C | RX-A | RX-B | RX-C | RX-A | RX-B | RX-C | RX-A | RX-B | RX-C | RX-A | RX-B | RX-C |
| 1 | × | ○ | — | ○ | × | — | ○ | ○ | — | ○ | ○ | — | ○ | ○ | — | ○ | ○ | — |
| 2 | — | — | ○ | — | — | ○ | — | — | × | — | — | ○ | — | — | ○ | — | — | ○ |
| 3 | — | — | ○ | — | — | ○ | — | — | ○ | — | — | × | — | — | ○ | — | — | ○ |
| 4 | ○ | ○ | — | ○ | ○ | — | ○ | ○ | — | ○ | ○ | — | × | ○ | — | ○ | × | — |

ONLY AT THE FIRST OPERATION START TIME

FIG.9

| | ERROR PATTERNS | 1 | 2 | 3 | 4 | 5 | 6 |
|---|---|---|---|---|---|---|---|
| RELIABILITY INFORMATION SHIFT REGISTER, INITIAL VALUE IN ( ) | [0]INPUT VALUES | 1 | 0 | 1 | 1 | 0 | 0 |
| | [0]   (0) | 2 | 2 | 2 | 2 | 2 | 2 |
| | [1]   (0) | 2 | 2 | 2 | 2 | 2 | 2 |
| | [2]   (2) | 1 | 1 | 0 | 1 | 1 | 0 |
| | [3]   (0) | 2 | 2 | 2 | 2 | 2 | 2 |
| | [4]   (0) | 2 | 2 | 2 | 2 | 2 | 2 |
| | [5]   (2) | 0 | 0 | 0 | 0 | 0 | 0 |
| | [6]   (0) | 2 | 2 | 2 | 2 | 2 | 2 |
| | [7]   (0) | 2 | 2 | 2 | 2 | 2 | 2 |
| | [8]   (2) | 0 | 0 | 0 | 1 | 1 | 0 |
| | [9]   (0) | 2 | 2 | 2 | 2 | 2 | 2 |
| | [10]  (0) | 2 | 2 | 2 | 2 | 2 | 2 |
| | [11]  (2) | 0 | 0 | 0 | 1 | 1 | 0 |
| | [12]  (0) | 2 | 2 | 2 | 2 | 2 | 2 |
| | [13]  (0) | 2 | 2 | 2 | 2 | 2 | 2 |
| | [14]  (2) | 0 | 0 | 0 | 0 | 0 | 0 |
| | [15]  (0) | 2 | 2 | 2 | 2 | 2 | 2 |
| | [16]  (0) | 2 | 2 | 2 | 2 | 2 | 2 |
| | [17]  (2) | 0 | 0 | 1 | 0 | 0 | 1 |
| POSITION OF ERROR IN TEMPORARY DECODED DATA SHIFT REGISTER (×) | TEMPORARY DECODED DATA VALUE SELECTED (WITH UPDATED VALUE OF SR0) | | | | × | | |
| | SR0 | | | | × | | |
| | SR1 | × | | × | | × | |
| | SR2 | × | | | | | |
| | SR3 | | | × | × | | |
| | SR4 | | | | × | | |
| | SR5 | | | × | | × | |
| | SR6 | | | | | | × |
| | SR7 | | | | | × | |
| | SR8 | | | × | × | | |
| | SR9 | | | | | | |
| | SR10 | | | × | × | × | |
| | SR11 | | | | × | × | |
| | SR12 | | | × | × | | |
| | SR13 | | | | | | |
| | SR14 | | | | × | | |
| | SR15 | | | | × | | |
| | SR16 | | | | × | | |
| | SR17 | | | | × | | |
| | SR18 | | | | × | | |
| | SR19 | | | | × | | |

METHOD FOR DECODING CONVOLUTIONALLY CODED SIGNALS AND DECODING APPARATUS AND RECEIVING APPARATUS USING THE SAME

BACKGROUND OF THE INVENTION

1. Field of the Invention

The present invention relates to a decoding technology and it particularly relates to a method for decoding convolutionally coded signals, and a decoding apparatus and a receiving apparatus utilizing said decoding method.

2. Description of the Related Art

One of coding techniques for correcting error of signals in a channel is the convolutional coding technique. The Viterbi decoder is a decoder that decodes convolutionally decoded signals. If this convolutional coding and the Viterbi decoding are combined together, a high error correction capability can be achieved (see Reference (1) enlisted in the following Related Art List, for instance).

Related Art List (1) Japanese Patent Application Laid-Open No. Hei05-244019.

In recent years, the convolutaional coding technique has also been applied to the mobile communication, wireless LAN and the like. Accordingly, there is a growing need for the decoding of convolutionally coded signals. In the Viterbi decoding, the amount of processing is generally large and the power consumption is also large. For this reason, a reduced amount of processing is now desired.

SUMMARY OF THE INVENTION

The inventor of the present invention has made the present invention in recognition of such circumstances and a general purpose of the present invention is to provide a decoding technique by which to reduce the processing amount for decoding the convolutionally coded signals.

In order to resolve the above problems, a decoding apparatus according to one embodiment of the present invention comprises: an input unit which inputs sequentially bit data wherein the bit data is convolutionally coded by a generator matrix defined according to a constraint length and a coding rate and has the number of streams defined by the coding rate; a delay unit which delays the bit data inputted by the input unit as a decoding result of the bit data, for at least a period of time corresponding to the constraint length; a generation unit which generates, per stream, bit data serving as candidates for a decoding, by performing exclusive OR based on the generator matrix on the bit data delayed by the delay unit and the bit data inputted in the input unit; and a selector which selects any of the bit data per stream generated by the generation unit, as a decoding result, and outputs the selected decoding result to the delay unit.

According to this embodiment, the exclusive OR operation based on a generator matrix is performed, so that the processing amount can be reduced. Also, since any of the bit data generated per stream is selected as a decoding result, the drop in receiving quality can be made smaller.

The number of streams for the bit data inputted in the input unit may be an odd number, and the selector may select the bit data as the decoding result, by applying a rule of majority to the odd number of bit data. In this case, the selection is made by invoking the rule of majority, so that the processing can be simplified.

The decoding apparatus may further comprise a correction unit which corrects the bit data delayed by the delay unit. The number of streams for the bit data inputted in the input unit is an add number, and bit data added by a depuncture processing is inserted into streams the number of which is less than the number of streams for the bit data; the selector selects any of bit data in streams other than streams corresponding to the bit data added by the depuncture processing and generates reliability information on the selected data bit; the delay unit delays the bit data selected by the selector and delays the reliability information generated by the selector; and the correction unit corrects the bit data based on the reliability information delayed by the delay unit and the reliability information generated by the selector. In this case, the bit data are corrected based on the reliability information, so that the drop in receiving quality can be made smaller.

Among the bit data inputted in the input unit there may exist a timing at which the number of bit data other than bit data added by the depuncture processing is 1; at the timing the selector may select bit data in streams other than streams corresponding to the bit data added by the depuncture processing and generate predetermined reliability information; and the correcting unit may correct the bit data at a timing when the number of bit data other than bit data added by the depuncture processing does not become 1. In this case, the decoding can be performed even if the number of bit data other than bit data added by the depuncture processing is 1.

The number of streams for the bit data inputted in the input unit may be an odd number, and the selector may add up the bit date, per stream, generated by the generator and, based on a addition result, may select bit data as a decoding result. In this case, the selection is made by applying a rule of majority, so that the processing can be simplified.

The decoding apparatus may further comprise a correction unit which corrects the bit data delayed by the delay unit. The number of streams for the bit data inputted in the input unit is an odd number, and bit data added by a depuncture processing is inserted into streams the number of which is less than the number of streams for the bit data; the selector adds bit data in streams other than streams corresponding to the bit data added by the depuncture processing and, based on an addition result, selects bit data as a decoding result and generates reliability information on the selected data bit; the delay unit delays the bit data selected by the selector and delays the reliability information generated by the selector; and the correction unit corrects the bit data based on the reliability information delayed by the delay unit and the reliability information generated by the selector. In this case, the bit data are corrected based on the reliability information, so that the drop in receiving quality can be made smaller.

Among the bit data inputted in the input unit, there may exist a timing at which the number of bit data other than bit data added by the depuncture processing is 1; at the timing the selector may not perform the addition, select bit data in streams other than streams corresponding to the bit data added by the depuncture processing and generate predetermined reliability information; and the correcting unit may correct the bit data at a timing when the number of bit data other than bit data added by the depuncture processing does not become 1. In this case, the decoding can be performed even if the number of bit data other than bit data added by the depuncture processing is 1.

Another embodiment of the present invention relates to a receiving apparatus. This apparatus comprises: a decoding apparatus; a Viterbi decoder; and a decoding selector which selects either one of the decoding apparatus and the Viterbi decoder.

According to this embodiment, the decoding apparatus is used for the purpose of reducing the processing amount, and the Viterbi decoder is used for the purpose of improving the receiving quality. Hence the reduction of the processing amount or the enhancement of the receiving quality can be achieved depending on its needs.

The receiving apparatus may further comprise an evaluation unit which evaluates a quality of bit data inputted to said receiving apparatus, and the decoding selector may make a selection based on an evaluation result in the evaluation unit. In this case, either one of the decoding apparatus and the Viterbi decoder can be selected depending on its needs.

The evaluation unit may measure the strength of a received signal comprised of bit data as the quality of the bit data, and the decoding selector may make a selection based on the strength measured by the evaluation unit. In this case, the selection is made according to the signal strength, so that the switching can be promptly performed even in the case where the signal strength varies.

As the quality of bit data, the evaluation unit may evaluate a degree of error contained in a decoding result in the decoding apparatus or the Viterbi decoder. The "degree of error" may be represented by the total number of error-occurring data among the decoded bit data or a ratio of error-occurring data to the decoded data bit. That is, the "degree of error" may be defined as long as it corresponds to an error occurrence frequency. In such a case, the switching is performed according to the degree of error contained in a decoding result in the decoding apparatus or the Viterbi decoder, so that the switching accuracy can be improved.

Still another embodiment of the present invention relates also to a receiving apparatus. This apparatus comprises: a decoding apparatus; an evaluation unit which evaluates the quality of a decoding result in the decoding apparatus; a Viterbi decoding unit; and a decoding selector which switches the use from the decoding apparatus to the Viterbi decoding unit, based on an evaluation result in the evaluation unit. As an evaluation of the decoding result, the evaluation unit detects a case where a correction has been made in the decoding apparatus, and as the number of detections in the evaluation unit increases, the decoding selector switches the use.

According to this embodiment, as the number of corrections increases, the decoding selector switches the use from the decoding apparatus to the Viterbi apparatus, so that the degradation of receiving quality can be suppressed.

Still another embodiment of the present invention relates also to a receiving apparatus. This apparatus comprises: a decoding apparatus; an evaluation unit which evaluates the quality of a decoding result in the decoding apparatus; and a notifying unit which conveys a transmission condition based on an evaluation result in the evaluation unit, to a transmitting apparatus.

According to this embodiment, the condition suited to the decoding apparatus can be informed to the transmitting apparatus.

Still another embodiment of the present invention relates to a decoding method. This method comprises: inputting sequentially bit data wherein the bit data is convolutionally coded by a generator matrix defined according to a constraint length and a coding rate and has the number of streams defined by the coding rate; delaying bit data as a decoding result of the inputted bit data, for at least a period of time corresponding to the constraint length; generating, per stream, bit data serving as candidates for a decoding, by performing exclusive OR based on the generator matrix on the delayed bit data and the inputted bit data; and selecting any of the bit data per stream generated by the generating, as a decoding result.

It is to be noted that any arbitrary combination of the aforementioned constituting elements, and the implementation of the present invention in the form of a method, an apparatus, a system and so forth may also be effective as and encompassed by the embodiments of the present invention.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIG. 2 illustrates a general description of processing by a puncture unit shown in FIG. 1;

FIG. 5 illustrates generation patterns of a single error when the coding rate is 5/8 in the decoding of FIG. 4;

FIG. 6 shows, in a decoding unit of FIG. 4, values of a reliability information shift register unit to specify generation patterns of a single error when the coding rate is 5/8 and positions of errors in a temporary decoded data shift register unit at the time when the generation patterns have been specified;

FIGS. 7A to 7C show a general outline of correction processing in a decoding unit of FIG. 4 when the coding rate is 5/8;

FIG. 8 illustrates generation patterns of a single error when the coding rate is 3/4 in a decoding unit of FIG. 4;

FIG. 9 shows, in a decoding unit of FIG. 4, values of a reliability information shift register unit to specify generation patterns of a single error when the coding rate is 3/4 and positions of errors in a temporary decoded data shift register unit at the time when the generation patterns have been specified;

DETAILED DESCRIPTION OF THE INVENTION

The invention will now be described by reference to the preferred embodiments. This does not intend to limit the scope of the present invention, but to exemplify the invention.

An outline of the present invention will be given before a specific description thereof. Exemplary embodiments of the present invention relate to a decoding apparatus for decoding convolutionally coded signals. If there are received data of constant three streams where the received data are convolutionally coded signals, the decoding apparatus will derive decoded data having more likelihood by using values of a shift register that stores temporary decoded data and the received data of three streams and then update by the derived decoded data the shift register which stores the temporary decoded data. Note that the decoded data having more likelihood is derived, by a rule of majority, for the respective received data of three streams and three data derived based on the values of a shift register.

In a case where there does not exist the received data of constant three or more valid streams which are not deleted by a puncture processing after a convolutional coding in a transmitting side, if there exists one piece of valid data, decoded data will be derived by using values of a shift register that stores the temporary decoded data streams and the received data and then update a shift register that stores the temporary decoded data streams. If there exist two or more pieces of valid data, decoded data of more likelihood will be derived by using the values of a shift register that stores the temporary decoded data streams and the received data of two streams or more and then update a shift register that stores the temporary decoded data streams. If the likelihood is equal to one another, decoded data will be determined by a predetermined rule and then a shift register that stores the temporary decoded data streams will be updated. Information on reliability of decoded data derived in a case where there are a plurality of valid received data is stored in a reliability information shift register. The values of a shift register that stores the temporary decoded data streams are corrected by values stored in the reliability information shift register and the reliability information.

Figure 1:
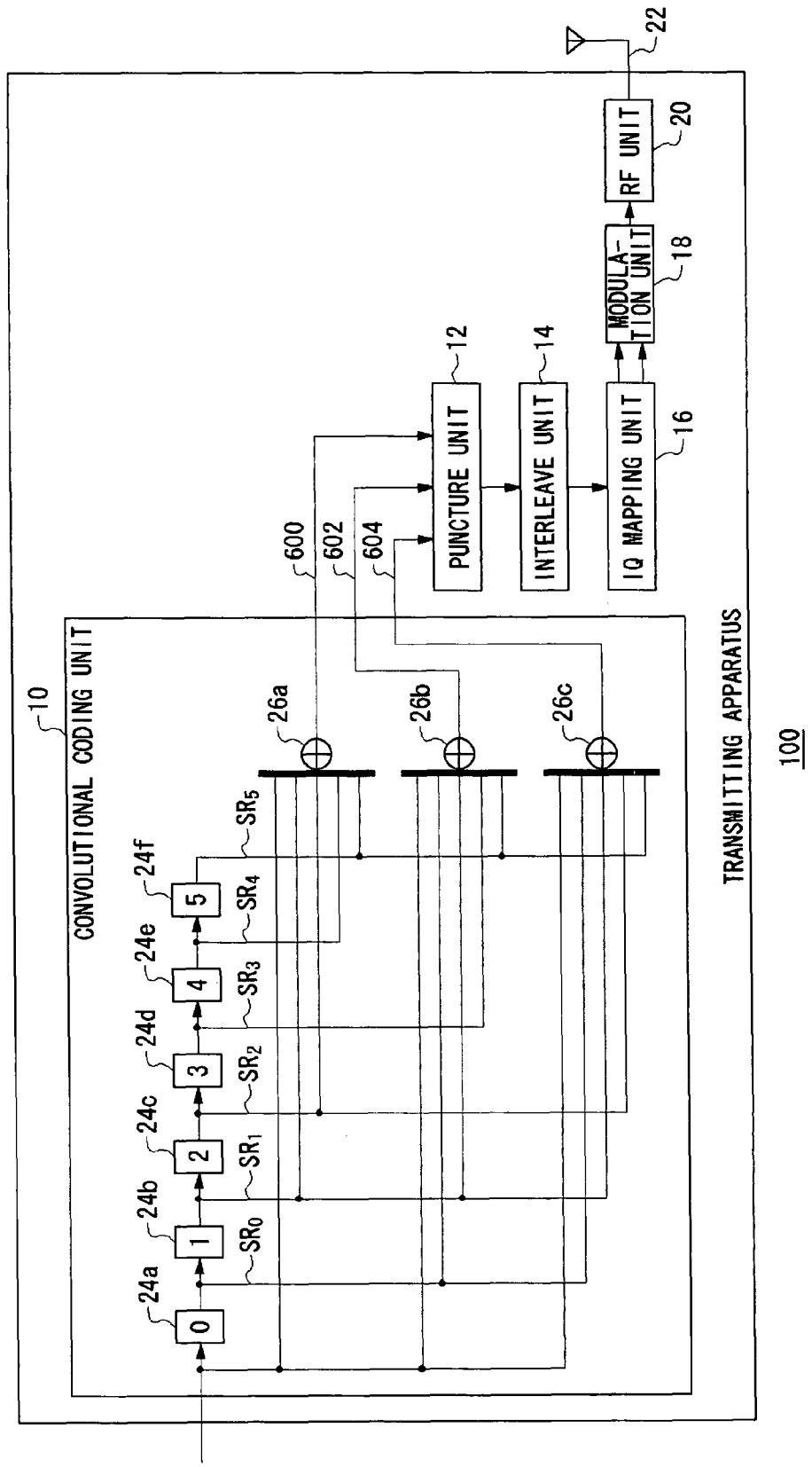
FIG. 1 illustrates a structure of a transmitting apparatus according to an exemplary embodiment of the present invention.

FIG. 1 illustrates a structure of a transmitting apparatus 100 according to an exemplary embodiment of the present invention. The transmitting apparatus 100 includes a convolutional coding unit 10, a puncture unit 12, an interleave unit 14, an IQ mapping unit 16, a modulation unit 18, an RF unit 20, and an antenna 22. The convolutional coding unit 10 includes a zeroth shift register 24a, a first shift register 24b, a second shift register 24c, a third shift register 24d, a fourth shift register 24e and a fifth shift register 24f, which are generically referred to as "shift register 24", and a first exclusive-OR unit 26a, a second exclusive-OR unit 26b and a third exclusive-OR unit 26c, which are generically referred to as "exclusive-OR unit 26". Signals involved include TX_A 600, TX_B 602 and TX_C 604.

The convolutional coding unit 10 performs convolutional coding. The convolutional coding is executed by shift registers 24 and exclusive-OR units 26, and it corresponds to a convolutional coding where the coding rate is 1/3 and the constraint length is 7. Here, if transmitted data which are inputted to the convolutional coding unit 10 is denoted by T and shift register values in the zeroth shift register 24a to the fifth shift register 24f are denoted by {SR0, SR1, SR2, SR3, SR4, SR5}, respectively, then convolutional codes outputted from the exclusive-OR units 26 will be represented, respectively, as follows.

$$TX\_A = T + SR1 + SR2 + SR4 + SR5 \quad (1)$$

$$TX\_B = T + SR0 + SR1 + SR3 + SR5 \quad (2)$$

$$TX\_C = T + SR0 + SR1 + SR2 + SR5 \quad (3)$$

Here, the addition (1) to (3) done in the exclusive-OR unit 26 is an exclusive OR operation, namely, a modulo-2 addition. The addition in the Equations hereunder will all be the modulo-2 addition unless otherwise specified. Note that a matrix whose components are constituted by the right-hand sides of Equation (1) to Equation (3) corresponds to a generator matrix in the convolutional coding.

The puncture unit 12 performs puncture processing on TX_A 600, TX_B 602 and TX_C 604, and thereby deletes unsent transmit data and adjusts a transmission rate. FIG. 2 illustrates a general description of processing by the puncture unit 12. A 1/3 space 500 shows a puncture processing at the coding rate of 1/3; a 1/2 space 502 shows a puncture processing at the coding rate of 1/2; a 5/8 space 504 shows a puncture processing at the coding rate of 5/8; and a 3/4 space 506 shows a puncture processing at the rate of 3/4. A processing step corresponds to a number by which to identify sequential convolutional codes. Referring to FIG. 2, in the case when the coding rates are 1/3 and 1/2, the processing step "1" only is available. When the coding rate is 5/8, the processing steps "1" to "5" are repeated, whereas when the coding rate is 3/4, the processing steps "1" to "3" are repeated. Refer now back to FIG. 1.

The interleave unit 14 performs a sequential parallel/serial transform on convolutional codes which have not been deleted in the puncture processing by the puncture unit 12, and then interleaves them. It is assumed herein that a rule of interleaving is predetermined. The IQ mapping unit 16 assigns the data interleaved by the interleave unit 14 onto a complex plane per multiple bits as in QPSK or QAM. The modulation unit 18 performs quadrature modulation on the signals assigned onto the complex plane. The RF unit 20 frequency-converts the signals which have been quadrature-modulated and then transmits the converted signals to a radio channel from the antenna 22.

In terms of hardware, this structure described as above can be realized by a CPU, a memory and other LSIs of an arbitrary computer. In terms of software, it can be realized by memory-loaded programs which have receiving functions and the like, but drawn and described herein are function blocks that are realized in cooperation with those. Hence, it is understood by those skilled in the art that these function blocks can be realized in a variety of forms such as by hardware only, software only or the combination thereof.

Figure 3:
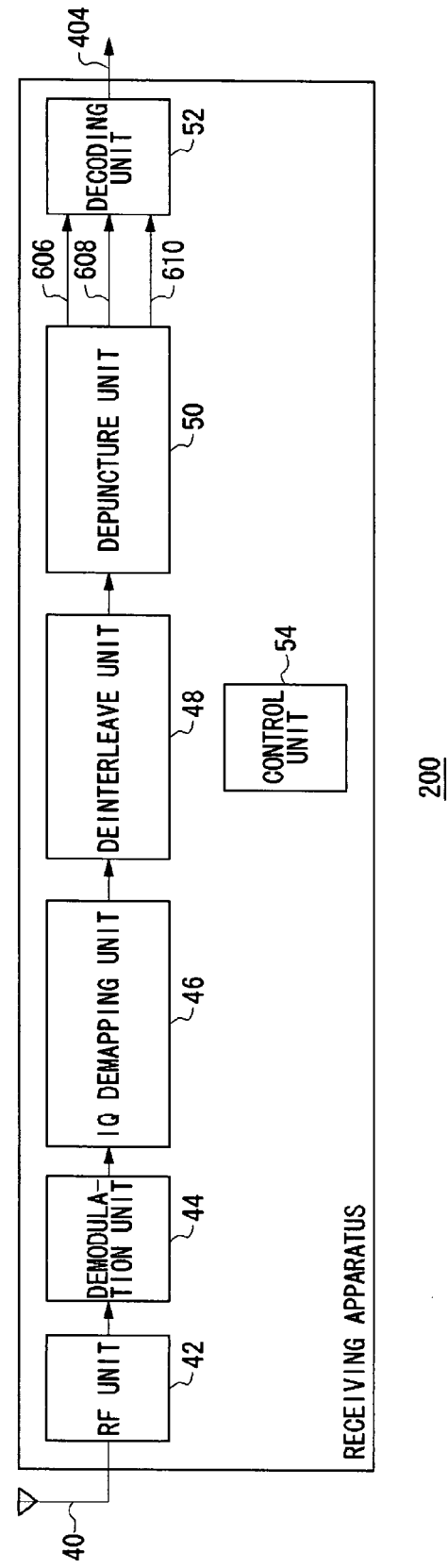
FIG. 3 illustrates a structure of a receiving apparatus according to an exemplary embodiment of the present invention.

FIG. 3 illustrates a structure of a receiving apparatus 200 according to an exemplary embodiment of the present invention. The receiving apparatus 200 includes an antenna 40, an RF unit 42, a demodulation unit 44, an IQ demapping unit 46, a deinterleave unit 48, a depuncture unit 50, a decoding unit 52, and a control unit 54. Signals involved include RX_A 606, RX_B 608, RX_C 610, and decoded data 404.

The antenna 40 receives signals coming from the transmitting apparatus shown in FIG. 1. The RF unit 42 converts the frequency of the received signals into intermediate frequency. The demodulation unit 44 performs quadrature detection on the intermediate signals and further performs coherent detection or differential detection. The IQ demapping unit 46 converts the demodulated signal into bit data. Assume that the processing by the IQ demapping unit 46 corresponds to the processing by the IQ mapping unit 16. The deinterleave unit 48 deinterleaves the bit data which have been converted by the IQ demapping unit 46. A deinterleaving rule is predetermined, and it corresponds to an interleaving rule in the interleave unit 14.

The depuncture unit 50 performs depuncture processing on the data which have been deinterleaved by the deinterleave unit 48. The depuncture processing is performed by inserting dummy bit or bits in the position marked with "delete" in FIG. 2. As a result, RX_A 606, RX_B 608 and RX_C 610 are outputted. The decoding unit 52 decodes RX_A 606 to RX_C 610 and outputs decoded data 404 as a result thereof. A detailed description of decoding will be given later. The control unit 54 controls the timing and operation of the receiving apparatus 200 as a whole.

Figure 4:
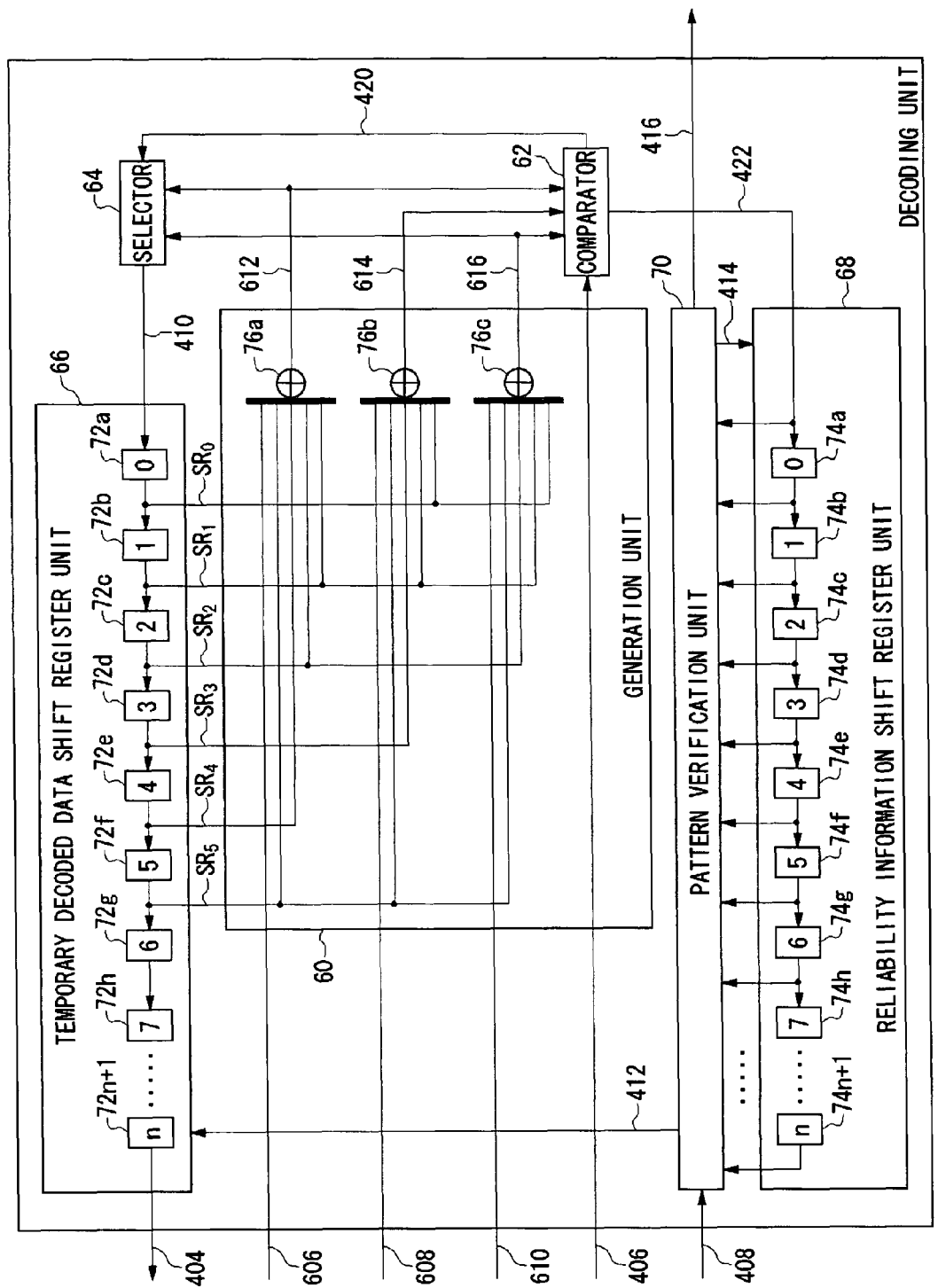
FIG. 4 illustrates a structure of a decoding unit shown in FIG. 3.

FIG. 4 illustrates a structure of the decoding unit 52. The decoding unit 52 includes a generation unit 60, a comparator 62, a selector 64, a temporary decoded data shift register unit 66, a reliability information shift register unit 68, and a pattern verification unit 70. The generation unit 60 includes a first exclusive-OR unit 76a, a second exclusive-OR unit 76b and a third exclusive-OR unit 76c, which are generically referred to as "exclusive-OR unit 76". The temporary decoded data shift register unit 66 includes a zeroth shift register 72a, a first shift register 72b, a second shift register 72c, a third shift register 72d, a fourth shift register 72e, a fifth shift register 72f, a sixth shift register 72g, a seventh shift register 72h, ... and an Nth shift register 72n+1, which are generically referred to as "shift register 72".

The reliability information shift register unit 68 includes a zeroth shift register 74a, a first shift register 74b, a second shift register 74c, a third shift register 74d, a fourth shift register 74e, a fifth shift register 74f, a sixth shift register 74g, a seventh shift register 74h, ... and an Nth shift register 74n+1, which are generically referred to as "shift register 74". Signals involved include puncture information 406, a coding rate 408, temporary decoded data 410, an error bit position 412, a reset signal 414, a verification error signal 416, a selection control signal 420, reliability information 422, DEC_A 612, DEC_B 614, and DEC_C 616.

The generation unit 60 successively receives the input of RX_A 606, RX_B 608 and RX_C 610. In this manner, the number of streams for the inputted bit data is "3", which is an odd number. Here, RX_A 606, RX_B 608 and RX_C 610 are bit data which are convolutionally coded, in the transmitting apparatus 100, by a generator matrix defined by a constraint length and a coding rate, and these bit data correspond to bit data having the number of streams defined based on the coding rate. In the case of the transmitting apparatus 100 shown in FIG. 1, the number of streams defined based on the coding rate is "3".

The temporary decoded data shift register unit 66 delays the bit data obtained as a result of the decoding of the bit data inputted to the generation unit 60, by the shift registers 72, for at least a period of time corresponding to the constraint length. Here, the constraint period is 7, so that the delay is executed for a period of the constraint length or more. Note that the number of shift registers 72 corresponds to the constraint length. In the following description, suppose that the decoding result is the temporary decoded data 410. Accordingly, the temporary decoded data shift register unit 66 stores the temporary decoded data 410 outputted from the selector 64.

The generation unit 60 performs an exclusive-OR operation based on the generator matrix, on the temporary decoded data 410 delayed by the temporary decoded data shift register unit 66 as well as RX_A 606, RX_B 608 and RX_C 610, so as to generate DEC_A 612, DEC_B 614 and DEC_C 616 for each stream. The temporary decoded data 410 in the temporary decoded data shift register unit 66 are expressed by {SR0, SR1, SR2, SR3, SR4, SR5}, as shown in FIG. 4. And RX_A 606 to RX_C 610 are decoded by using RX_A 606 to RX_C 610 and values in the temporary decoded data shift register 66. In the modulo-2 addition, X=−X, hence, a slight manipulation of Equations (1) to (3) will result in the following Equations (4) to (6).

$$T = TX\_A + SR1 + SR2 + SR4 + SR5 \quad (4)$$

$$T = TX\_B + SR0 + SR1 + SR3 + SR5 \quad (5)$$

$$T = TX\_C + SR0 + SR1 + SR2 + SR5 \quad (6)$$

If there is no transmit data which are not deleted by the puncture processing and there is no receiving error, then RX_A=TX_A, RX_B=TX_B and RX_C=TX_C hold. Hence, Equations (4) to (6) are expressed as follows.

$$T = RX\_A + SR1 + SR2 + SR4 + SR5 \quad (7)$$

$$T = RX\_B + SR0 + SR1 + SR3 + SR5 \quad (8)$$

$$T = RX\_C + SR0 + SR1 + SR2 + SR5 \quad (9)$$

Setting each T in Equations (7) through (9) to DEC_A, DEC_B and DEC_C results in the following Equations (10) to (12).

$$DEC\_A = RX\_A + SR1 + SR2 + SR4 + SR5 \quad (10)$$

$$DEC\_B = RX\_B + SR0 + SR1 + SR3 + SR5 \quad (11)$$

$$DEC\_C = RX\_C + SR0 + SR1 + SR2 + SR5 \quad (12)$$

Equations (10), (11) and (12) correspond respectively to DEC_A 612, DEC_B 614 and DEC_C 616, which are derived in the generation unit 60. A matrix whose components are constituted by the right-hand sides of the respective Equations (10), (11) and (12), corresponds to a generator matrix in the convolutional coding the same way as in the right-hand sides of Equations (1) to (3).

If the coding rate is 1/3, the operation results of Equations (10) to (12), namely DEC_A 612 to DEC_C 616 shall match each other. If, however, a single error occurs, one of these will not match with the remaining two being matched. In the comparator 62, whether DEC_A 612, DEC_B 614 and DEC_C 616 match or not is verified. If, for example, DEC_A 616 differs among DEC_A 612 to DEC_C 616, then the comparator 62 will determine that DEC_A 612 and DEC_B 614 are correct. In this manner, by invoking the rule of majority for the odd number of bit data which are DEC_A 612 to DEC_C 616, the comparator 62 selects the bit data as a decoding result and outputs the result thereof to the selector 64 as a selection control signal 420.

Based on the selection control signal 420, the selector 64 selects any one of DEC_A 612 to DEC_C 616 as a decoding result and outputs the thus selected decoding result to the temporary decoded data shift register unit 66 as temporary decoded data 410. In the above-described case, the selector 64 selects DEC_A 612 and outputs it to the temporary decoded data shift register unit 66. Even if DEC_B 614 differs in the comparator 62, the selector 64 will select DEC_A 612 in a similar manner and output it to the temporary decoded data shift register unit 66. If, on the other hand, DEC_A 612 differs in the comparator 62, the selector 64 will select DEC_C 616 and output it to the temporary decoded data shift register unit 66. If no error occurs, DEC_A612, DEC_B614 and DEC_C616 will match and therefore the selector 64 will select DEC_A 612 and output it to the temporary decoded data shift register unit 66. The comparator 62 outputs the selection control signal 420 so that the selection as above is made by the selector 64.

Since a single error is assumed here, temporary decoded data 410 inputted to the temporary decoded data register unit 66 is a correct decoding result. Accordingly, after appropriate delay is executed by the temporary decoded shift register unit 66, decoded data 404 are outputted as a final decoding result. If the coding rate is 1/3, the decoding unit 52 may output the temporary decoded data 410 intact. With the above processing performed, the values of the temporary decoded data 410 stored in the temporary decoded data shift register unit 66 are sequentially updated to the correct values that correspond to the shift registers 24 in the convolutional coding unit in the transmit processing. Thus, the occurrence of a single error continues to be detected and such error can be corrected.

Next, a description is given of a case when the coding rate is 1/2. In the case when the coding rate is 1/2, DEC_B 614 is invalid data which has been deleted by the puncture processing as shown in FIG. 2, so that the decoding unit 52 compares DEC_A 612 and DEC_C 616 and corrects a single error. In this manner, the number of streams for bit data inputted to the generation unit 60 is "3" but the bit data, namely DEC_B 614, which has been added by the depuncture processing, is inserted to a stream of "1" which is an odd number and less than the number of streams for the bit data.

The selector 64 selects one from among bit data in a stream other than DEC_B 614. Here, DEC_A 612 is constantly selected. If no error occurs, DEC_A 612 and DEC_C 616 match. The selector 64 outputs the selected DEC_A 612 to the decoded data shift register unit 66 as the temporary decoded data 410. The comparator 62 generates reliability information on the bit data selected by the selector 64. For instance, if DEC_A 612 and DEC_C 616 match, the comparator 62 outputs the reliability information "0" to the reliability information shift register unit 68. If error occurs in one of DEC_A 612 and DEC_C 616, DEC_A 612 and DEC_C 616 will not match. Then, the selector 64 outputs DEC_A612 to the temporary decoded data shift register unit 66 and the comparator 62 outputs the reliability information "1" to the reliability information shift register 68. The reliability information "0" corresponds to a case where the reliability of the temporary decoded data 410 is high, whereas the reliability information "1" corresponds to a case where the reliability of the temporary decoded data 410 is low.

The temporary decoded data shift register unit 66 delays the temporary decoded data of the bit data selected by the selector 64, by the shift registers 72. The reliability information shift register unit 68 delays the reliability information generated by the comparator 62, by the shift registers 74. The pattern verification unit 70 corrects the temporary decoded data 410 delayed by the temporary decoded data shift register unit 66. Here, the pattern verification unit 70 corrects the temporary decoded data 410, based on the reliability information 422 delayed by the reliability information register unit 68 and the reliability information 422 generated by the comparator 62. The detail will be described as follows.

Assume that no error occurs in RX_A 606 and RX_C 610 at the next time instant. Assume also that RX_A 606 at the previous time instant is correct and error occurs in RX_C 610. Then, since DEC_A 612 at the previous time instant is correct, the reliability information shift register unit 68 is properly updated. Therefore, DEC_A 612 and DEC_C 616 match. In that case, too, the selector 64 outputs DEC_A 612 to the temporary decoded data shift register unit 66 and then the temporary decoded shift register unit 66 is updated. The comparator 62 outputs the reliability information "0" to the reliability information shift register unit 68.

If, on the other hand, error occurs in RX_A 606 in the previous time instant and RX_C 610 is correct, DEC_A 612 at the previous time instant is not correct, so that the value SR0 of the temporary decoded data 410 stored in the zeroth shift register 72a of the temporary decoded data shift register unit 66 is a result which has been inverted from the correct value. As evident from the modulo-2 addition processing in the exclusive-OR unit 76 or Equations (10) and (12), SR0 is used in deriving DEC_C 616 in the third exclusive-OR unit 76c but not used in deriving DEC_A 612 in the first exclusive-OR unit 76a. Thus, even if RX_A 606 and RX_C 610 are correct, it will turn out that DEC_A 612 is correct but DEC_C 616 is not correct, so that DEC_A 612 and DEC_C 616 do not match. At this time, the comparator 62 outputs the reliability information "1".

As described above, when it is detected that the value of the zeroth shift register 74a is "1" and the reliability information 422 generated in the comparator 62 is "0", the pattern verification unit 70 determines that DEC_C 616 in the previous time instant is in error. Further, the pattern verification unit 70 also determines that the value of the zeroth shift register 72a in the temporary decoded data shift register 66 is correct. When, on the other hand, it is detected that the value of the zeroth shift register 74a is "1" and the reliability information 422 generated in the comparator 62 is "1", the pattern verification unit 70 determines that RX_A 606 in the previous time instant is error.

Further, the pattern verification unit 70 also determine that the value of the zeroth shift register 72a in the temporary decoded shift register 66 is in error. In this case, the pattern verification unit 70 outputs an error bit position 412 corresponding to a position of the determined error. Then the temporary decoded data shift register unit 66 inverts the value of the zeroth shift register 72 according to the error bit position 412, inputs the inverted value to the first shift register 72b and updates the shift register 72 by inputting the temporary decoded data 410 to the zeroth shift register 72a. Note signal that if the pattern verification unit 70 detects error in the above-described processing, the pattern verification unit 70 will output a verification error signal 416. The verification error signal 416 is a signal indicating a valid value when error is detected by the pattern verification unit 70. The verification error signal 416 may also be a signal indicating a valid value when the correction is made in the pattern verification unit 70.

A description will now be given of a case when the coding rate is 5/8. In the case when the coding rate is 5/8, RX_A 606 and RX_B 608 become valid in the processing steps "1", "3" and "5" and RX_C 610 becomes valid in the processing steps "2" and "4" after having been subjected to the depuncture processing. Accordingly, there exist a timing at which the number of bit data other than the bit data added by the depuncture processing is 1. FIG. 5 illustrates generation patterns of a single error when the coding rate is 5/8 in the decoding unit 52. As shown in FIG. 5, there are an error pattern #1 space 510 to an error pattern #8 space 524, that is, there are eight types of error patterns. In FIG. 5, "circle" corresponds to the correct data, "X-mark" corresponds to the error data, and "-" corresponds to the invalid data. Now refer back to FIG. 4.

In addition to the above-described processing, the selector 64 selects, at the above-described timings, bit data in streams other than the streams corresponding to the bit data added by the depunture processing, and then outputs these as the temporary decoded data 410. Here, RX_C 610 is selected. The selector 64 selects DEC_A 612 if RX_A 606 and RX_B 608 are valid, whereas it selects DEC_C 616 if RX_C 610 is valid.

The comparator 62 generates predetermined reliability information at the above-described timings, and outputs this as the reliability information 422. The comparator 62 generates the reliability information "0" if DEC_A 612 and DEC_B 614 match; it generates the reliability information "1" if it does not match; and it generates the reliability information "2" if RX_C 610 is valid. Here, the reliability information "2" indicates the invalidity.

If a single error occurs as in FIG. 5 based on the above operation, the values stored in the temporary decoded data shift register unit 66 and the reliability information shift register unit 68 are shown in FIG. 6. FIG. 6 shows, in the decoding unit 52, values of the reliability information shift register unit 68 to specify generation patterns of a single error when the coding rate is 5/8 and positions of errors in the temporary decoded data shift register unit 66 at the time when the generation patterns have been specified. The upper part shows values in the temporary data shift register unit 66 and the lower part shows values in the reliability information shift register unit 68. The values in FIG. 6 are each associated with the error pattern shown in FIG. 5. Now refer back to FIG. 4.

The pattern verification unit 70 verifies sequentially the generation patterns of a single error. And if they match, a corresponding error bit position 412 is outputted to the temporary decoded data shift register unit 66. After the temporary decoded data shift register unit 66 corrects the error according to the error bit position 412, it updates the shift register 72. Further, the pattern verification unit 70 resets the values of "1" in the reliability information shift register unit 68 to "0". Thus, the pattern verification unit 70 outputs a reset signal 414. The values of the reliability information shift register unit 68 where the error has been corrected are delayed to a certain degree and are then outputted as final decoded data 404. Note that the pattern verification unit 70 performs the correction at the timing when the number of bit data other than the bit data added by the depuncture processing does not become 1.

Now, how to obtain error positions in the temporary data shift register unit 66 will be described with reference to FIGS. 7A to 7C. FIGS. 7A to 7C show a general outline of correction processing in the decoding unit 52 when the coding rate is 5/8. FIG. 7A corresponds to the error pattern 3 of FIG. 5, FIG. 7B corresponds to the error pattern 4 of FIG. 5, and FIG. 7C corresponds to the error pattern 5 of FIG. 5. Here, a received data space 530 indicates values of RX_A 606 to RX_C 610. A decoding result space 532 values of DEC_A 612 to DEC_C 616. A comparison result space 534 for comparing DEC_A and DEC_B indicates a comparison result in the comparator 62. A temporary decoded data space 536 indicates values of temporary decoded data 410 selected by the selector 64. A temporary decoded data shift register space 538 indicates values held in the shift registers 72. Note that the initial values of the temporary decoded data shift register 72 are all set to "0's" and hence it is assumed that only "0's" are received. As a result, the single error is indicated as "1".

(1) The generation unit 60 derives DEC_A 612 to DEC_C 616, based on Equations (10), (11) and (12).

(2) If RX_C 610 is invalid data, the comparator 62 will compare DEC_A 612 and DEC_B 614 so as to check for a match or nonmatch.

(3) If RX_C 610 is invalid data, the selector 64 will select DEC_A 610 as the temporary decoded data 410 and output it to the zeroth shift register 72a of the temporary decoded data shift register unit 66. If RX_A 606 and RX_B 608 are invalid data, the selector 64 will select DEC_C 616 as the temporary decoded data 410 and output it to the zeroth shift register 72a of the temporary decoded data shift register unit 66. The first shift register 72b to the Nth shift register 72n+1 in the temporary data shift register unit 66 are each shifted per step.

Repeating the above processes results in what is shown in FIGS. 7A to 7C. In every one of error patterns 3, 4 and 5, the comparator 62 detects, for the first time, the nonmatch of DEC_A 612 and DEC_B 614, at the processing step t=3. In the processing step t=1, the comparator 62 has already detected the match of DEC_A 612 and DEC_B 614. Thus, it is obvious that, at the processing step t=3, either one of RX_A 606 and RX_B 608 suffers error. At the processing step t=4, the valid data is RX_C 610 only, so that no comparison is made-by the comparator 62. Next time when DEC_CA 612 and DEC_B 614 can be compared will be at the processing step t=5. At this point, the pattern 4 is the only case where DEC_A 612 and DEC_B 614 are nonmach. Thus, if a result of {nonmatch, no comparison, nonmatch} is obtained as the reliability information 422, it can be specified that the pattern 4 is the case.

Since it is assumed here that the initial values in the temporary decoded shift register unit 66 are all set to "0" and those to be received are only "0's", the values held in the temporary decoded shift register unit 66 and the temporary decoded data 410 must all be "0's". As a result, the data bit which is "1" suffers error among the values held in the temporary decoded shift register unit 66 and the temporary decoded data 410. The data bits which are "1's" are the temporary decoded data 410 and the values held in the zeroth shift register 72a and the first shift register 72b. Hence, those values may be inverted to correct the error. Note that such inverting processing is not shown in FIGS. 7A to 7C. As for the patterns 3 and 5, every one of them up to the processing step t=5 shows a result of {nonmatch, no comparison, match}, so that the pattern cannot be specified.

Accordingly, the above-described processing will proceed until such processing timing when the comparison result of DEC_A 612 and DEC_C 616 differs in between the pattern 3 and the pattern 5. At the point of processing step t=8 where the result shows {nonmatch} in the pattern 3 and it shows {match} in the pattern 5, the pattern 3 and the pattern 5 can be determined for the first time. As for the pattern 3, data bits bearing "1" that indicates error in the temporary decoded data 410 and the temporary decoded shift register unit 66 at the point of processing step t=8 are the temporary decoded data 410, the zeroth shift register 72a, the first shift register 72b, the second shift register 72c, the third shift register 72d and the fifth shift register 72f. On the other hand, the pattern 5 does not contain data bits bearing "1" that indicates error, so that no correction is necessary. As described above, other single error patterns are also checked beforehand. The pattern verification unit 70 has stored beforehand the positional relationship between the error patterns and error correction positions, and corrects the values of the temporary decoded data shift register unit 66.

Finally, a description will be given of a case when the coding rate is 3/4. FIG. 8 illustrates generation patterns of a single error when the coding rate is 3/4 in the decoding unit 52. As shown in FIG. 8, there are an error pattern #1 space 510 to an error pattern #6 space 520, that is, there are six types of error patterns. Since FIG. 8 is represented the same way as FIG. 5, the explanation thereof is omitted. Since the operations of the comparator 62 and the selector 64 are the same as those in above-described case of the coding rate of 5/8, the description thereof is omitted. FIG. 9 shows values of the reliability information shift register unit 68 to specify generation patterns of a single error when the coding rate is 3/4 and positions of errors in the temporary decoded data shift register unit 66 at the time when the generation patterns have been specified, in the decoding unit 52. Since FIG. 9 is represented in a similar manner to FIG. 6, the description thereof is omitted.

Hereinbelow, modifications to the exemplary embodiments will be described. In the exemplary embodiments, the comparator 62 detects the match of DEC_A 612 to DEC_C 616 so as to determine the temporary decoded data 410. According to a modification, an exclusive-OR operation by a generator matrix similar to that in the transmitting side is executed, and its result is added up. Further, in this modification, the temporary decoded data 410 is determined based on the magnitude of the addition result.

Figure 10:
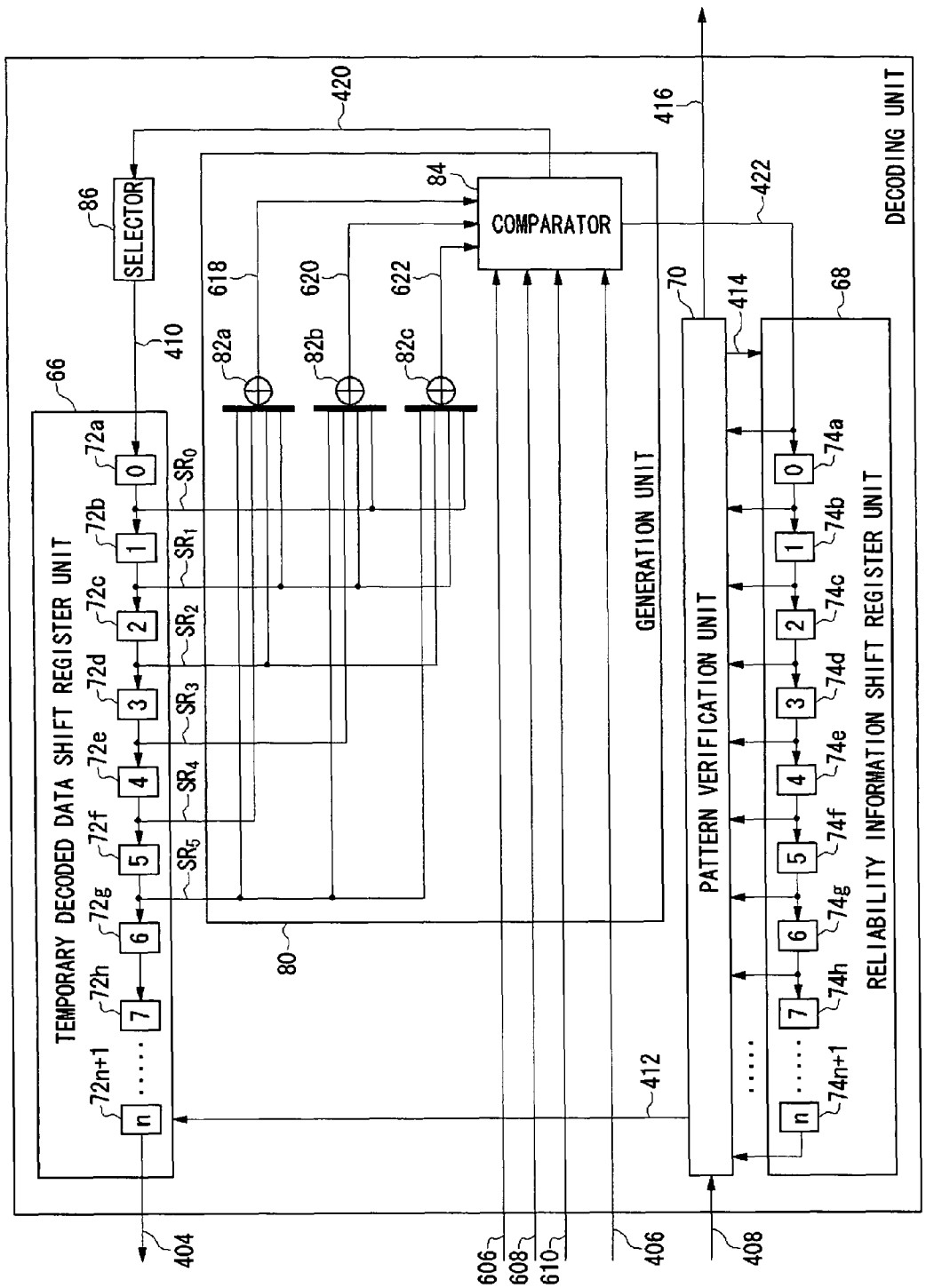
FIG. 10 illustrates another structure of a decoding unit shown in FIG. 3.

FIG. 10 illustrates another structure of the decoding unit 52. The decoding unit 52 includes a generation unit 80, a selector 64, a temporary decoded data shift register unit 66, a reliability information shift register unit 68, and a pattern verification unit 70. The generation unit 80 includes a first exclusive-OR unit 82a, a second exclusive-OR unit 82b and a third exclusive-OR unit 82c, which are generically referred to as "exclusive-OR unit 82", and a comparator 84. The temporary decoded data shift register unit 66 includes a zeroth shift register 72a, a first shift register 72b, a second shift register 72c, a third shift register 72d, a fourth shift register 72e, a fifth shift register 72f, a sixth shift register 72g, a seventh shift register 72h, . . . and an Nth shift register 72n+1, which are generically referred to as "shift register 72".

The reliability information shift register unit 68 includes a zeroth shift register 74a, a first shift register 74b, a second shift register 74c, a third shift register 74d, a fourth shift register 74e, a fifth shift register 74f, a sixth shift register 74g, a seventh shift register 74h, . . . and an Nth shift register 74n+1, which are generically referred to as "shift register 74". Signals involved include puncture information 406, a coding rate 408, temporary decoded data 410, an error bit position 412, a reset signal 414, a verification error signal 416, a selection control signal 420, reliability information 422, DEC_A 618, DEC_B 620, and DEC_C 622. In FIG. 10, the components given the same reference numerals as those in FIG. 4 have the same functions as those corresponding to FIG. 4.

The generation unit 80 receives the input of bit data of the odd number of streams, which are RX_A 606, RX_B 608 and RX_C 610 here. The generation unit 80 uses RX_A 606 to RX_C 610 and the values {SR0, SR1, SR2, SR3, SR4, SR5} and estimates the likelihood of either "0" or "1" as decoded data. More specifically, the comparator 84 executes at least one of exclusive OR of DEC_A 618 and RX_A 606 and exclusive OR of DEC_B 620 and RX_B 608 and exclusive OR of DEC_C 622 and RX_C 610. The comparator 84 then adds, to this result, bit data per stream generated by an addition generator and thereafter, based on this addition result, selects bit data as a decoding result.

The shift register 72 performs the following exclusive OR.

$$DEC\_A = SR1 + SR2 + SR4 + SR5 \quad (13)$$

$$DEC\_B = SR0 + SR1 + SR3 + SR5 \quad (14)$$

$$DEC\_C = SR0 + SR1 + SR2 + SR5 \quad (15)$$

If the register values {SR0, SR1, SR2, SR3, SR4, SR5} match both in transmission and receiving, the convolutional coding will be indicated by Equations (1), (2) and (3). Thus, the expectation values of transmitted data in the case of T=0 and received data in the case when decoded data becomes "0" are as follows.

$$TX\_A0 = RX\_A0 = DEC\_A \quad (16)$$

$$TX\_B0 = RX\_B0 = DEC\_B \quad (17)$$

$$TX\_C0 = RX\_C0 = DEC\_C \quad (18)$$

Also, the expectation values of transmitted data in the case of T=1 and received data in the case when decoded data becomes "1" are as follows.

$$TX\_A1 = RX\_A1 = 1 + DEC\_A \quad (19)$$

$$TX\_A1 = RX\_A1 = 1 + DEC\_B \quad (20)$$

$$TX\_A1 = RX\_A1 = 1 + DEC\_C \quad (21)$$

Based on Equations (13), (14) and (15), the comparator 84 detects whether RX_1 606 to RX_C 610 are close to Equations (16) to (18) or Equations (19) to (21). Accordingly, the Hamming distance between two cases (T=0 and T=1) is calculated as follows.

$$S = \{RX\_A + DEC\_A\} + \{RX\_B + DEC\_B\} + \{RX\_C + DEC\_C\} \quad (22)$$

Here, the addition within { } is the modulo-2 addition and the addition outside { } is the normal addition which is not the modulo-2 addition.

The Hamming distance in the case when the coding rate is 1/2 and the transmitted data is at T=0, is expressed, as follows, based on Equations (13), (14) and (15).

$$\begin{aligned} S &= \{DEC\_A + DEC\_A\} + \{DEC\_B + DEC\_B\} + \\ &\quad \{DEC\_C + DEC\_C\} \\ &= 0 + 0 + 0 \\ &= 0 \end{aligned} \quad (23)$$

On the other hand, the Hamming distance in the case of T=1 is expressed, as follows, based on Equations (19), (20) and (21).

$$\begin{aligned} S &= \{1 + DEC\_A + DEC\_A\} + \{1 + DEC\_B + DEC\_B\} + \\ &\quad \{1 + DEC\_C + DEC\_C\} \\ &= 1 + 1 + 1 \\ &= 3 \end{aligned} \quad (24)$$

Accordingly, when S=0, the decoded data is estimated to be "0". When S=3, the decoded data is estimated to be "1". If error occurs in RX_A 606, the Hamming distance in the case of T=0 is expressed as follows.

$$\begin{aligned} S &= \{DEC\_A + 1 + DEC\_A\} + \{DEC\_B + DEC\_B\} + \\ &\quad \{DEC\_C + DEC\_C\} \\ &= 1 + 0 + 0 \\ &= 1 \end{aligned} \quad (25)$$

On the other hand, the Hamming distance in the case of T=1 is expressed as follows.

$$\begin{aligned} S &= \{1 + DEC\_A + 1 + DEC\_A\} + \{1 + DEC\_B + DEC\_B\} + \\ &\quad \{1 + DEC\_C + DEC\_C\} \\ &= 0 + 1 + 1 \\ &= 2 \end{aligned} \quad (26)$$

The same holds true for a single error in RX_B 608 and RX_C 610. Thus, when S=1, the decoded data can be estimated to be "0". When S=2, the decoded data can be estimated to be "1". The comparator 84 carries out estimations based on such equations as Equation (22). And the comparator 84 outputs to the selector 86 a selection control signal 420 specifying "0" as temporary decoded data 410 to be inputted to the temporary decoded data shift register unit 66 or outputs thereto a selection control signal 420 specifying "1". After temporary decoded data 410 are delayed appropriately by the temporary decoded data shift register unit 66, the temporary decoded data 410 are outputted as the final decoded data 404.

If the coding rate is 1/2, RX_B 608 will become invalid by the puncture processing, according to FIG. 2 as described above. Hence, the comparator 84 adds bit data in streams other than those corresponding to the bit data added by the depuncture processing, selects the bit data as a decoding result, based on the addition result and, at the same time, generates reliability information for the thus selected bit data, based on the addition result. Equation (22) is now expressed as follows.

$$S=\{RX\_A+DEC\_A\}+\{RX\_C+DEC\_C\} \quad (27)$$

If no error occurs, the similar calculation to Equation (23) and Equation (24) results in S=0 with T=0 and S=2 with T=1. In this case, the comparator 84 outputs "0" to the reliability information shift register unit 68 as the reliability information 422 indicating that no error occurs. Also, the comparator 84 outputs to the selector 86 the selection control signal 420 specifying "0" or "1" as the temporary decoded data 410. In the case of a simple error occurring in RX_A 606 or RX_C 610, the similar calculation to Equation (25) and Equation (26) results in S=1 with T=0 and S=1 with T=1. In such a case, the comparator 84 outputs "1" to the reliability information shift register unit 68 as the reliability information 422 indicating that error has occurred. Also, the comparator 84 instructs the selection unit 86 to input the result of {RX_A+DEC_A} as the temporary decoded data 410. In the same manner as in the above-described exemplary embodiment, in the next time instant the pattern verification unit 70 can determine if error occurs in RX_B 608 of the previous time instant or not, and therefore it can correct values held in the temporary data shift register unit 66.

If the coding rate is 5/8, RX_A 606 and RX_B 608 or RX_C 610 will become invalid by the puncture processing, according to FIG. 2 as described above. At the timing when RX_A 606 and RX_B 608 become invalid by the puncture processing, the comparator 84 performs nothing but the addition by exclusive OR, selects a result of the exclusive OR of RX_C 610 and DEC_C 622, and outputs the value set beforehand. Equation (22) is expressed as follows if RX_C 610 is invalid.

$$S=\{RX\_A+DEC\_A\}+\{RX\_B+DEC\_B\} \quad (28)$$

Also, Equation (22) is expressed as follows if RX_A 606 and RX_B 608 are invalid.

$$S=\{RX\_C+DEC\_C\} \quad (29)$$

If no error occurs, the similar calculation to Equation (23) and Equation (24) results in S=0 with T=0 and S=2 with T=1 for Equation (28). In this case, the comparator 84 inputs "0" to the reliability information shift register unit 68 as the reliability information 422 indicating no error. Also, the comparator 84 outputs to the selector 86 the selection control signal 420 specifying "0" or "1" as the temporary decoded data 410 to be inputted to the reliability information shift register unit 68. In the case of a simple error occurring in RX_A 606 or RX_C 610, the similar calculation to Equation (25) and Equation (26) results in S=1 with T=0 and S=1 with T=1. In such a case, the comparator 84 outputs "1" to the reliability information shift register unit 68 as the reliability information 422 indicating that error has occurred. Also, the comparator 84 instructs the selection unit 86 to input the result of {RX_A+DEC_A} as the temporary decoded data 410 to be inputted to the temporary decoded data shift register unit 66.

If no error occurs, the similar calculation to Equation (23) and Equation (24) results in S=0 with T=0 and S=1 with T=1 for Equation (29). In this case, the comparator 84 outputs to the reliability information shift register unit 68 the reliability information "2" indicating the invalidation of reliability. Also, the comparator 84 instructs the selection unit 86 to input the result of {RX_C+DEC_C} as the temporary decoded data 410 to be inputted to the temporary decoded data shift register 66. With the above-described processing, the pattern verification unit 70 verifies the values of the reliability information shift register at the timing when the number of bit data other than the bit data added by the depuncture processing does not become 1, so that the bit position of the temporary decoded shift register to be corrected is identified.

In the case of the coding rate 3/4, too, RX_A 606 and RX_B 608 or RX_C 610 are/is invalid by the puncture processing the same way as in the case of the coding rate 5/8. Hence, the decoding unit 52 performs the same processing as in the case when the coding rate is 5/8. With the above-described processing, similar to the above exemplified embodiment the pattern verification unit 70 verifies the values of the reliability information shift register at the timing when the number of bit data other than the bit data added by the depuncture processing does not become 1, so that the bit position of the temporary decoded shift register to be corrected is identified.

Figure 11:
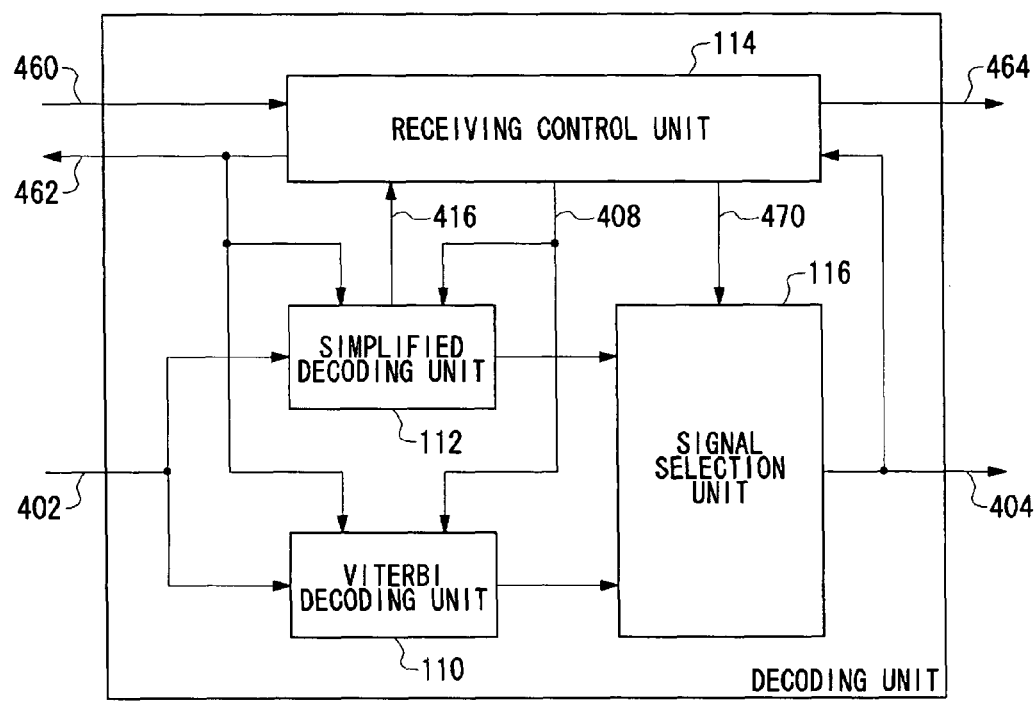
FIG. 11 illustrates still another structure of a decoding unit shown in FIG. 3.

FIG. 11 illustrates still another structure of the decoding unit 52. The decoding unit 52 includes a Viterbi decoding unit 110, a simplified decoding unit 112, a receiving control unit 114, and a signal selection unit 116. Signals involved include an SNR estimate value 460, a receiving-interrupt processing signal 462, a retransmission requesting signal 464, and a selection signal 470.

The Viterbi decoding unit 110 performs Viterbi decoding on received data 402. Here, since the Viterbi decoding is a known technology, the description thereof is omitted. The simplified decoding unit 112 corresponds to the decoding unit in the exemplary embodiments and the modification described above. The signal selection unit 116 selects, as a decoding result, an output from the Viterbi decoding unit 110 or an output from the simplified decoding unit 112. Note that selection is made based on the selection signal 470 from the receiving control unit 114. Also, the receiving control unit 114 evaluates the quality of a decoding result in the decoding unit 52. The receiving control unit 114 conveys a transmission condition based on an evaluation result, to a transmitting apparatus 100 (not shown). Note that the receiving control unit 114 may be so structured as to perform any of the following operations (1) to (7).

(1) The receiving control unit 114 receives an SNR estimate value 460 estimated in a not-shown estimation unit, determines the use of the simplified decoding unit 112 under satisfactory communication environments where an SNR is at a predetermined threshold value or above, and determines the use of Viterbi decoding unit 110 under circumstances where the SNR is below the threshold value.

(2) The receiving control unit 114 uses the Viterbi decoding unit 110 to decode a part of the received data and uses the simplified decoding unit 112 to decode the remaining received data. For instance, when a packet signal composed of a control signal and a data signal is to be decoded, the receiving control unit 114 uses the Viterbi decoding unit 110 to decode the control signal and uses the simplified decoding unit 112 to decode the data signal.

(3) Suppose that the simplified decoding unit 112 is used here. When the receiving control unit 114 detects that a packet lost accumulated value or verification error accumulated value for reliability information streams is 1 or above, the receiving control unit 114 determines the lowering of the data rate and conveys the result thereof to the transmitting apparatus 100. The reduced data rate reduces the error occurrence frequency, too. As a result, the reduction in receiving quality is prevented.

(4) When, in the case where the simplified decoding unit 112 is used, the receiving control unit 114 detects that the packet lost accumulated value or verification error accumulated value for reliability information streams is 1 or above, the receiving control unit 114 determines the shortening of the data length of a packet and conveys the result thereof to the transmitting apparatus 100. Shortening the data length of a packet reduces the frequency of retransmission because of error.

(5) When, in the case where the simplified decoding unit 112 is used, the receiving control unit 114 detects that the packet lost accumulated value or verification error accumulated value for reliability information streams is 1 or above, the receiving control unit 114 switches the use of the decoding unit from the simplified decoding unit 112 to the Viterbi decoding unit 110.

(6) When the receiving control unit 114 detects the verification error signal 416 in the reliability information streams, the receiving control unit 114 stops the receiving processing such as decoding processing and conveys this to the not-shown control unit 54 as the receiving-interrupt processing signal 462.

(7) When the receiving control unit 114 detects the verification error signal 416 in the reliability information streams, the receiving control unit 114 conveys to the Viterbi decoding unit 110 to the effect that the retransmission requesting signal 464 needs to be transmitted.

Here, a detailed description will be given of the above (1) and (5) regarding the receiving control unit 114. The above structure corresponds to an embodiment where the simplified decoding is performed if the communication environment is satisfactory and the Viterbi decoding is performed if the communication environment degrades. An advantage of this structure is that the processing amount and power consumption are reduced and at the same time the degradation of receiving quality can be suppressed. Now this structure will be described below in the form of first to fourth modifications.

Modification 1

The not-shown SNR estimate unit is included in the demodulation unit 44 shown in FIG. 3. The SNR estimate unit measures the SNR of an intermediate frequency signal or a quadrature-detected baseband signal. This processing corresponds to measuring the strength of a received signal based on which the received data 402 are formed. The measured SNR corresponds to the quality of the received data 402. The SNR measurement unit outputs the measured SNR to the decoding unit 52 as the SNR estimate value 460.

The receiving control unit 114 compares the SNR estimate value 460 against a predetermined threshold value. If the SNR estimate value 460 is more satisfactory than the threshold value, the receiving control unit 114 will determine the execution of simplified decoding. As a result, the receiving control unit 114 generates a selection signal 470 by which to select the simplified decoding unit 112, and outputs the thus generated selection signal 470. If, on the other hand, the SNR estimate value 460 is worse than the threshold value, the receiving control unit 114 will determine the execution of Viterbi decoding. As a result, the receiving control unit 114 generates a selection signal 470 by which to select the Viterbi decoding, and outputs the thus generated selection signal 470.

Either the Viterbi decoding unit 110 or the simplified decoding unit 112 becomes active according to the content of the selection signal 470, and then performs the decoding processing. The signal selector 116 outputs the decoding result as the decoded data 404. Such processing performed by the receiving control unit 114 corresponds to the selection of decoding processing based on the SNR estimated in the SNR estimate unit.

Modification 2

When it starts the receiving processing, the receiving control unit 114 has the simplified decoding unit 112 perform the decoding and has the signal selector 116 output the decoded data from the simplifier decoding unit 112 as the final decoded data 404. The receiving control unit 114 receives the decoded data 404. It is assumed here that error check codes such as CRC are contained in the decoded data 404. The error check codes may be those used in a known technique. By the use of error check codes, the receiving control unit 114 can check whether the decoding has been done normally or not.

That is, the receiving control unit 114 accumulates the number of decoding error occurrences and compares it with a predetermined threshold value. This corresponds to evaluating the degree of error contained in the decoding result in the simplified decoding unit 112. If the number of occurrences becomes greater than the threshold value, the receiving control unit 114 will switch from the use of the simplified decoding unit 112 to the use of the Viterbi decoding unit 110. As a result, the Viterbi decoding unit 110 performs decoding and the signal selector 116 outputs the decoded data from the Viterbi decoding unit 110 as the final decoded data 404. Note that the receiving control unit 114 may switch from the use of the Viterbi decoding unit 110 to the use of the simplified decoding unit 112. In this case, the receiving control unit 114 evaluates the degree of error contained in the decoding result in the Viterbi decoding unit 110.

Modification 3

When starting a receiving processing, the receiving control unit 114 has the simplified decoding unit 112 perform the decoding and has the signal selector 116 output the decoded data from the simplified decoding unit 112 as the final decoded data 404. The receiving control unit 114 receives the verification error signal 416 from the simplified decoding unit 112, accumulates the number of occurrences of the verification error signal 416, and compares it with a predetermined threshold value. This corresponds to accumulating the cases when correction is done in the pattern verification unit 70. If the number of occurrences becomes greater than the threshold value, that is, if the number of performing the correction increases, the receiving control unit 114 will switch the use from the use of the simplified decoding unit 112 to the use of the Viterbi decoding unit 110. As a result, the Viterbi decoding unit 110 performs decoding and the signal selector 116 outputs the decoded data from the Viterbi decoding unit 110 as the final decoded data 404.

Modification 4

The receiving control unit 114 may control the Viterbi decoding unit 110, the simplified decoding unit and the signal selection unit 116 by combining the modification 1 to the modification 3. For instance, when starting a receiving processing, the receiving control unit 114 has the simplified decoding unit 112 perform the decoding and has the signal selection unit 116 output the decoded data from the simplified decoding unit 112 as the final decoded data 404. As described in the modification 2 or the modification 3, the receiving control unit 114 switches the use from the use of the simplified decoding unit 112 to the use of the Viterbi decoding unit 110. Thereafter, as described in the modification 1, the receiving control unit 114 compares the SNR estimate value 460 against the threshold value. If the SNR estimate value 460 becomes greater than the threshold value, the receiving control unit 114 will determine that the decoding by the simplifier decoding unit 112 is possible, and switch again to the decoding by the use of the simplified decoding unit 112.

According to the present embodiments, the exclusive OR is performed based on a generator matrix, so that the processing amount can be reduced. Since the processing amount is reduced, the power consumption can be reduced. Since any of the bit data generated per stream is selected as a decoding result, the drop in receiving quality can be minimized. Since the selection is made by applying the rule of majority, a simplified processing can be achieved. The present embodiments can be used even in a case where the data invalidated by the puncture processing are contained. Since the bit data are corrected based on the reliability information, the drop in receiving quality can be minimized. The decoding can be performed even in a case when the number of bit data other than those added by the depuncture processing is 1.

The simplified decoding unit is used to reduce the processing amount, whereas the Viterbi decoding unit is selected to improve the receiving quality. Thus the selection can be made between the reduction of processing amount and the improvement in receiving quality, according to need. Also, a condition appropriate for the decoding apparatus can be conveyed to the transmitting apparatus. Compared with a Viterbi decoding unit, it can be structured in a simplified manner and the circuit scale can be made smaller. The verification error in the reliability information allows estimating in advance the occurrence of packet loss. The demodulation or decoding processing is stopped immediately after the verification error has been detected, so that wasteful consumption of electric power can be prevented.

Either the simplified decoding unit or the Viterbi decoder can be selected according to the quality. Also, since the selection is made according to an SNR estimate value, the switching can be promptly performed even in the case where the SNR estimate value varies. The switching is made according to the degree of error contained in the final decoded data in the simplified decoder or the Vitervi decoder, so that the switching accuracy can be improved. As the number of cases when the correction is needed increases, switching is made from the simplified decoding unit to the Viterbi decoder. Thus, the degradation of the receiving quality can be suppressed. Also, if the communication environment is excellent, the power consumption can be reduced. Even if the communication environment deteriorates, the reduction in throughput due to data retransmission can be suppressed.

The present invention has been described based on the exemplary embodiments and modifications. These embodiments and modifications are merely exemplary, and it is understood by those skilled in the art that other various modifications to the combination of each component and each process thereof are possible and that such other modifications are also within the scope of the present invention.

What is claimed is:

1. A decoding apparatus, comprising:
an input unit which inputs sequentially bit data wherein the bit data is convolutionally coded by a generator matrix defined according to a constraint length and a coding rate and has the number of streams defined by the coding rate;
a delay unit which delays the bit data inputted by said input unit as a decoding result of the bit data, for at least a period of time corresponding to the constraint length;
a generation unit which generates, per stream, bit data serving as candidates for a decoding, by performing exclusive OR based on the generator matrix on the bit data delayed by said delay unit and the bit data inputted in said input unit; and
a selector which selects any of the bit data per stream generated by said generation unit, as a decoding result, and outputs the selected decoding result to said delay unit.

2. A decoding apparatus according to claim 1, wherein the number of streams for the bit data inputted in said input unit is an odd number, and
wherein said selector selects the bit data as the decoding result, by applying a rule of majority to the odd number of bit data.

3. A decoding apparatus according to claim 1, further comprising a correction unit which corrects the bit data delayed by said delay unit,
wherein the number of streams for the bit data inputted in said input unit is an add number, and bit data added by a depuncture processing is inserted into streams the number of which is less than the number of streams for the bit data,
wherein said selector selects any of bit data in streams other than streams corresponding to the bit data added by the depuncture processing and generates reliability information on the selected data bit,
wherein said delay unit delays the bit data selected by said selector and delays the reliability information generated by said selector, and
wherein said correction unit corrects the bit data based on the reliability information delayed by said delay unit and the reliability information generated by said selector.

4. A decoding apparatus according to claim 3, wherein among the bit data inputted in said input unit there exists a timing at which the number of bit data other than bit data added by the depuncture processing is 1,
wherein at said timing said selector selects bit data in streams other than streams corresponding to the bit data added by the depuncture processing and generates predetermined reliability information, and
wherein said correcting unit corrects the bit data at a timing when the number of bit data other than bit data added by the depuncture processing does not become 1.

5. A receiving apparatus, comprising:
a decoding apparatus according to claim 3;
an evaluation unit which evaluates the quality of a decoding result in said decoding apparatus;
a Viterbi decoding unit; and
a decoding selector which switches the use from said decoding apparatus to said Viterbi decoding unit, based on an evaluation result in said evaluation unit,
wherein, as an evaluation of the decoding result, said evaluation unit detects a case where a correction has been made in said decoding apparatus, and
wherein as the number of detections in said evaluation unit increases, said decoding selector switches the use.

6. A receiving apparatus, comprising:
a decoding apparatus according to claim 3;
an evaluation unit which evaluates the quality of a decoding result in said decoding apparatus; and
a notifying unit which conveys a transmission condition based on an evaluation result in said evaluation unit, to a transmitting apparatus.

7. A decoding apparatus according to claim 1, wherein the number of streams for the bit data inputted in said input unit is an odd number, and Wherein said selector adds up the bit date, per stream, generated by said generator and, based on a addition result, selects bit data as a decoding result.

8. A decoding apparatus according to claim 1, further comprising a correction unit which corrects the bit data delayed by said delay unit,
    wherein the number of streams for the bit data inputted in said input unit is an odd number, and bit data added by a depuncture processing is inserted into streams the number of which is less than the number of streams for the bit data,
    wherein said selector adds bit data in streams other than streams corresponding to the bit data added by the depuncture processing and, based on an addition result, selects bit data as a decoding result and generates reliability information on the selected data bit,
    wherein said delay unit delays the bit data selected by said selector and delays the reliability information generated by said selector, and
    wherein said correction unit corrects the bit data based on the reliability information delayed by said delay unit and the reliability information generated by said selector.

9. A decoding apparatus according to claim 8, wherein among the bit data inputted in said input unit there exists a timing at which the number of bit data other than bit data added by the depuncture processing is 1,
    wherein at said timing said selector does not perform the addition, selects bit data in streams other than streams corresponding to the bit data added by the depuncture processing and generates predetermined reliability information, and
    wherein said correcting unit corrects the bit data at a timing when the number of bit data other than bit data added by the depuncture processing does not become 1.

10. A receiving apparatus, comprising:
    a decoding apparatus according to claim 1;
    a Viterbi decoder unit; and
    a decoding selector which selects either one of said decoding apparatus and said Viterbi decoder.

11. A receiving apparatus according to claim 10, further comprising-an evaluation unit which evaluates a quality of bit data inputted to said receiving apparatus,
    wherein said decoding selector makes a selection based on an evaluation result in said evaluation unit.

12. A receiving apparatus according to claim 11, wherein as the quality of bit data said evaluation unit measures the strength of a received signal comprised of bit data, and
    wherein said decoding selector makes a selection based on the strength measured by said evaluation unit.

13. A receiving apparatus according to claim 11, wherein as the quality of bit data said evaluation unit evaluates a degree of error contained in a decoding result in said decoding apparatus or said Viterbi decoder.

14. A decoding method, comprising:
    inputting sequentially bit data wherein the bit data is convolutionally coded by a generator matrix defined according to a constraint length and a coding rate and has the number of streams defined by the coding rate;
    delaying bit data as a decoding result of the inputted bit data, for at least a period of time corresponding to the constraint length;
    generating, per stream, bit data serving as candidates for a decoding, by performing exclusive OR based on the generator matrix on the delayed bit data and the inputted bit data; and
    selecting any of the bit data per stream generated by said generating, as a decoding result.

* * * * *